United States Patent
Saint-Marcoux et al.

(10) Patent No.: US 10,427,536 B2
(45) Date of Patent: Oct. 1, 2019

(54) METHOD FOR ESTIMATION OF THE REHABILITATION TIME OF THE PERFORMANCE OF A TRACTION BATTERY OF A HYBRID VEHICLE

(71) Applicant: RENAULT s.a.s., Boulogne-Billancourt (FR)

(72) Inventors: Antoine Saint-Marcoux, Palaiseau (FR); Manoela Ferreira-De-Araujo, Cachan (FR)

(73) Assignee: RENAULT s.a.s, Boulogne-Billancourt (FR)

( * ) Notice: Subject to any disclaimer, the term of this patent is extended or adjusted under 35 U.S.C. 154(b) by 249 days.

(21) Appl. No.: 15/313,406

(22) PCT Filed: May 19, 2015

(86) PCT No.: PCT/FR2015/051297
§ 371 (c)(1),
(2) Date: Nov. 22, 2016

(87) PCT Pub. No.: WO2015/181465
PCT Pub. Date: Dec. 3, 2015

(65) Prior Publication Data
US 2017/0144561 A1    May 25, 2017

(30) Foreign Application Priority Data
May 27, 2014    (FR) ...................... 14 54754

(51) Int. Cl.
*B60L 50/16*    (2019.01)
*B60L 50/61*    (2019.01)
(Continued)

(52) U.S. Cl.
CPC ......... *B60L 11/1861* (2013.01); *B60L 3/0046* (2013.01); *B60L 15/2045* (2013.01);
(Continued)

(58) Field of Classification Search
CPC .................................................. B60L 11/1861
(Continued)

(56) References Cited

U.S. PATENT DOCUMENTS

| 5,815,824 | A | * | 9/1998 | Saga | ...................... | B60K 6/46 701/22 |
| 5,905,360 | A | * | 5/1999 | Ukita | ...................... | B60K 6/28 320/118 |

(Continued)

OTHER PUBLICATIONS

International Search Report dated Sep. 15, 2015 in PCT/FR2015/051297 filed May 19, 2015.
(Continued)

*Primary Examiner* — Jerry D Robbins
(74) *Attorney, Agent, or Firm* — Oblon, McClelland, Maier & Neusadt, L.L.P.

(57) ABSTRACT

A method estimates a duration of a battery performance rehabilitation phase. The method includes activating the battery performance rehabilitation phase when a power available in a battery is below a required minimum power level. The method also includes supplying a model of operation of the battery including, in a plane (BSOC, T) where BSOC denotes a state of charge of the battery and where T denotes a battery temperature, an isopower curve representing operating points of the battery enabling the battery to substantially deliver the required minimum power level, the curve separating operating points making it possible to deliver a power level above the required minimum power level from operating points enabling the battery to deliver only a power level below the required minimum power level. The method also includes estimating the duration of the battery performance rehabilitation phase from the model of operation supplied.

12 Claims, 1 Drawing Sheet

(51) Int. Cl.

| | | |
|---|---|---|
| *B60W 10/08* | (2006.01) | |
| *B60L 11/18* | (2006.01) | |
| *G01R 31/367* | (2019.01) | |
| *H01M 10/44* | (2006.01) | |
| *H02J 7/00* | (2006.01) | |
| *H02J 7/14* | (2006.01) | |
| *B60W 20/13* | (2016.01) | |
| *H01M 10/48* | (2006.01) | |
| *B60L 3/00* | (2019.01) | |
| *B60L 15/20* | (2006.01) | |
| *B60L 58/12* | (2019.01) | |

(52) U.S. Cl.
CPC ............ *B60L 50/16* (2019.02); *B60L 58/12* (2019.02); *B60W 20/13* (2016.01); *G01R 31/367* (2019.01); *H01M 10/44* (2013.01); *H01M 10/443* (2013.01); *H01M 10/48* (2013.01); *H01M 10/486* (2013.01); *H02J 7/007* (2013.01); *H02J 7/0047* (2013.01); *H02J 7/14* (2013.01); *B60L 2240/12* (2013.01); *B60L 2240/545* (2013.01); *B60L 2240/547* (2013.01); *B60L 2240/549* (2013.01); *B60L 2240/80* (2013.01); *B60L 2260/44* (2013.01); *H01M 2220/20* (2013.01); *H02J 2007/005* (2013.01); *Y02T 10/645* (2013.01); *Y02T 10/70* (2013.01); *Y02T 10/705* (2013.01); *Y02T 10/7005* (2013.01); *Y02T 10/7044* (2013.01); *Y02T 10/7077* (2013.01); *Y02T 10/72* (2013.01); *Y02T 10/7283* (2013.01)

(58) Field of Classification Search
USPC .......................................................... 320/162
See application file for complete search history.

(56) References Cited

U.S. PATENT DOCUMENTS

| | | | | |
|---|---|---|---|---|
| 5,945,808 | A * | 8/1999 | Kikuchi | ................... B60K 6/46 320/132 |
| 7,986,055 | B2 * | 7/2011 | Owens | .................... H02J 9/002 307/10.7 |
| 8,294,416 | B2 * | 10/2012 | Birke | ................. G01R 31/3675 320/107 |
| 2003/0042866 | A1 | 3/2003 | Minamiura et al. | |
| 2008/0284378 | A1 | 11/2008 | Birke et al. | |
| 2008/0311466 | A1 | 12/2008 | Yang et al. | |
| 2010/0145562 | A1 * | 6/2010 | Moran | ..................... B60K 6/46 701/22 |
| 2010/0181959 | A1 * | 7/2010 | Gibbs | ................ F02N 11/0866 320/104 |
| 2011/0068740 | A1 * | 3/2011 | Ang | ..................... B60L 11/1861 320/109 |
| 2011/0276206 | A1 * | 11/2011 | Tofukuji | ............... B60L 11/185 701/22 |

OTHER PUBLICATIONS

French Search Report dated Jan. 21, 2015 in FR 1454754 filed May 27, 2014.

* cited by examiner

METHOD FOR ESTIMATION OF THE REHABILITATION TIME OF THE PERFORMANCE OF A TRACTION BATTERY OF A HYBRID VEHICLE

BACKGROUND

The present invention relates to a method for estimating the duration of a battery performance rehabilitation phase, the latter being able to be a battery charging phase.

The invention applies preferentially to a traction battery of a hybrid vehicle equipped with a hybrid power train, comprising a heat engine and at least one electrical machine intended to ensure, together or independently, the provision of a torque at the wheels of the vehicle. The invention applies in a non-limiting manner to a traction battery implemented in a hybrid power train architecture requiring, in a launch or "take-off" phase from stopped and at low speeds of displacement of the vehicle, the power supplied at the wheels to originate exclusively from the vehicle traction battery. Such is the case in certain architectures where, by construction, the heat engine can be involved in the propulsion of the vehicle only for a predetermined target vehicle speed, such that the power train has only the electrical energy stored in the traction battery of the vehicle to ensure the starting and the displacement of the vehicle until said predetermined target vehicle speed is reached, at which point the heat then cuts in.

In this type of architecture, to avoid a temporary immobilization of the vehicle, the traction battery must therefore always be able to supply a required minimum power level making it possible to ensure the take-off of the vehicle. At any instant, the discharging power available on the battery depends on its state of charge (the more discharged the battery, the less power it will be able to supply), on its temperature (the colder the battery, the less power it will be able to supply) and its state of aging (the older the battery, the less power it will be able to supply). Also, in practice, it is best to ensure that the battery always remains at a minimum state-of-charge level and at a minimum temperature level enabling it to ensure the required minimum power level. To do this, it is known practice to use an energy management law in the computer dedicated to battery management, making it possible to order the recharging of the battery as soon as it is too discharged, for example when its state-of-charge falls below a critical threshold, either by the activation of a regenerative braking system, or by the activation of a generator system which is itself driven by the heat engine of the vehicle. The energy management law can also be designed to make it possible to limit the power supplied by the traction battery when its state of charge becomes close to a minimum threshold below which it can no longer ensure the required minimum power level.

In certain extreme cases of use, the energy management law applied by the computer does not however make it possible to maintain the battery in conditions enabling it to ensure the required minimum power level. The vehicle is then potentially in a situation of temporary immobilization, in which the traction battery is incapable of supplying the required traction power to ensure the take-off of the vehicle from stopped and at low speeds of displacement of the vehicle.

The patent document FR2992274, in the name of the applicant, discloses a method for controlling the recharging of a hybrid vehicle traction battery equipped with a hybrid power train exhibiting the limitations as explained above, this method providing, on forced stopping of the vehicle, for the heat engine to drive the electrical machine operating in generator mode to recharge the battery, while the starting of the vehicle is purely and simply refused until the state of charge of the battery has gone back above a threshold enabling it to supply the required minimum power level.

A drawback of this system is that the vehicle is blocked until the traction battery performance is rehabilitated, in other words until the latter reverts to state-of-charge and temperature conditions enabling it to supply the required minimum power level. The immobilizing of the vehicle on the road may indeed be temporary, but it nevertheless places the driver in an uncomfortable and anxious situation, not knowing the battery performance rehabilitation time after which the required minimum power can be supplied in order to restart the vehicle.

Also, there is a need to be able to obtain an accurate estimation of the duration of this battery performance rehabilitation phase and, in particular, to be able to estimate the duration of a charging phase of a traction battery of a hybrid vehicle activated when stopped to bring this battery to state-of-charge and temperature conditions enabling it to supply a required minimum power level.

BRIEF SUMMARY

This aim is achieved by virtue of a method for estimating the duration of a battery performance rehabilitation phase, characterized in that it comprises steps of:

activating the battery performance rehabilitation phase if the power available in the battery is below a required minimum power level, said phase making it possible to bring said battery to state-of-charge and temperature conditions enabling it to supply said required minimum power level, supplying a model of operation of the battery including, in a plane (BSOC, T) where BSOC denotes the state of charge of the battery and where T denotes the temperature of the battery, an isopower curve representing, in said plane, the operating points of the battery enabling it to substantially deliver said required minimum power level, said curve separating the operating points making it possible to deliver a power level above the required minimum power level from the operating points enabling it to deliver only a power level below the required minimum power level, estimating the duration of said battery performance rehabilitation phase from said model of operation supplied.

Preferably, said battery performance rehabilitation phase consists of a battery charging phase.

Advantageously, the step of estimating the duration of said charging phase comprises steps of:

determining the value of the current supplied to the battery during said charging phase; and from an operating point of the battery defined by the temperature of the battery and the state of charge of the battery at the instant of activation of the charging phase, said operating point allowing it to deliver only a power level below the required minimum power level, determining, as a function of said current supplied to the battery, the duration of said charging phase as being the time needed to bring the operating point of the battery to said isopower curve.

Preferably, the method comprises the step of locally linearizing said isopower curve so as to define a state-of-charge threshold varying linearly with the battery temperature for which the battery is able to supply said required minimum power level, the duration of said charging phase being determined relative to this state-of-charge threshold.

Advantageously, the battery is a traction battery of a hybrid vehicle, comprising a heat engine and at least one electric motor, and in said charging phase is carried out by using said at least one electric motor in generator mode.

Preferably, said required minimum power level corresponds to the traction power required to ensure the take-off of the vehicle from stopped and at low speeds of displacement of the vehicle up to a predetermined target vehicle speed.

Advantageously, the method can comprise the step of displaying the estimated duration of said battery performance rehabilitation phase.

A computer program product is also proposed, comprising instructions for performing the steps of the method described above when this program is run by a processor.

The method described above can thus be implemented by digital processing means, for example a microprocessor, a microcontroller or similar.

Also proposed is a device for estimating the duration of a battery performance rehabilitation phase making it possible to bring said battery to state-of-charge and temperature conditions enabling it to supply a required minimum power level, said device comprising means for storing a model of operation of the battery including, in a plane (BSOC, T) where BSOC denotes the state of charge of the battery and where T denotes the temperature of the battery, an isopower curve representing, in said plane, the operating points of the battery enabling it to substantially deliver said required minimum power level, said curve separating the operating points making it possible to deliver a power level above the required minimum power level from the operating points enabling it to deliver only a power level below the required minimum power level, and computation means capable of estimating the duration of said battery performance rehabilitation phase from said model of operation supplied.

Also proposed is a motor vehicle comprising a detection device as described above.

BRIEF DESCRIPTION OF THE DRAWINGS

Other particular features and advantages of the invention will emerge on reading the description given hereinbelow of a particular embodiment of the invention, given in an indicative but non-limiting manner, with reference to the attached drawings in which.

DETAILED DESCRIPTION

The description hereinbelow is given in the context of estimating the duration of a charging phase of the traction battery of a hybrid vehicle equipped with a hybrid power train comprising a heat engine and at least one electric motor, in which the battery charging phase aims to ensure the "take-off" of the vehicle when the vehicle is stopped or at low speeds via the electric motor, in the case where the traction battery has a state of charge that is too low to supply the required minimum power level making it possible for said vehicle to "take off".

By way of example, the required minimum power level can be rated to meet the following constraints: launch the vehicle on starting using only the electric motor on a standardized slope until a target speed of the vehicle of 10 km/h is reached, from which the heat engine can cut in. According to this rating case, the required minimum power level is set at at least 5 kW.

Figure 1:
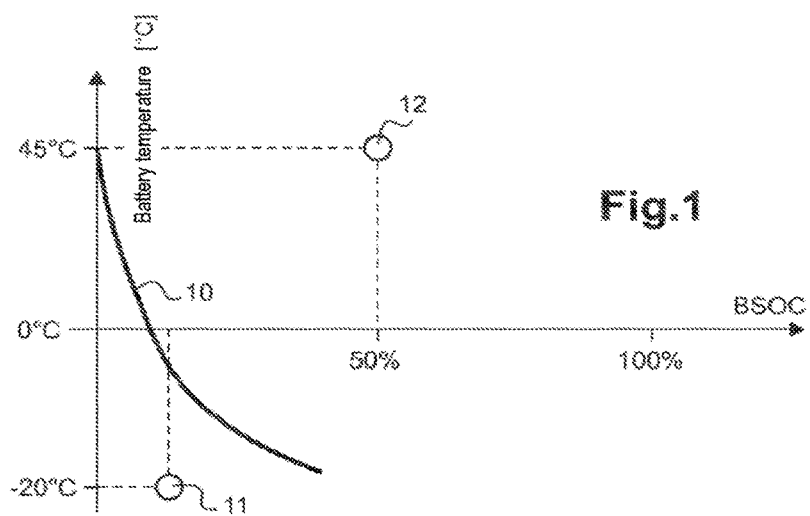
FIG. 1 illustrates a model of operation of the battery in the temperature/state-of-charge plane, said model of operation comprising an isopower curve corresponding to a required minimum power level that can be supplied by said battery.

Referring to FIG. 1, the invention consists in having a model of operation of the battery in the temperature/state-of-charge plane (BSOC) of the battery, which exhibits a portion which extends substantially along an isopower curve 10 plotted in this plane and corresponding to the required minimum power level that can be supplied by said battery, i.e. 20 kW according to the rating case given above by way of example. The isopower curve 10 is therefore a curve in the battery temperature/state-of-charge plane, along which the power supplied by the battery is constant and corresponds to the minimum power level required by the predefined rating case. The operating points of the battery situated below this isopower curve 10 (state of charge or temperature of the battery lower), for example the point 11, correspond to the operating points for which the battery will not be able to supply the required minimum power level. Consequently, the driver will potentially be temporarily immobilized. By contrast, the operating points of the battery situated above the isopower curve 10 (state of charge or temperature of the battery higher), for example the point 12, correspond to the operating points for which the battery will be able to supply the required minimum power level.

There now follows a description, initially, of the equations which characterize the trend of the battery temperature and of the state of charge, in battery charging phase.

The variables which will be used hereinbelow are as follows:

$T_{BAT}$: the temperature of the battery—unit [° C.]
$T_{ext}$: the outside temperature—unit [° C.]
$I_{BAT}$: the current flowing through the battery (positive when discharging, negative when charging)—unit [A],
BSOC: state of charge of the battery (Battery State Of Charge)—unit [%],
$Q_{max}$: total battery capacity—unit [A.h.]
$C_p$: heat capacity of the battery—unit [J/kg/K]
m: the weight of the battery—unit [kg]
R: the internal resistance of the battery—unit [Ohm]
h: the coefficient of convection between the battery and the outside—unit [W/m$^{2/K}$]
S: the surface area of exchange with the outside—unit [m$^2$]
ε: the creation of heat by a heating system—unit [W]

The following term is also defined:

$$\tau = \frac{m \cdot C_p}{h \cdot S}$$

The trend of the temperature of the battery is controlled by the following equation:

$$m \cdot C_p \cdot \frac{\partial T_{BAT}}{\partial t} = R \cdot (I_{BAT})^2 + \varepsilon - h \cdot S \cdot (T_{BAT} - T_{ext}) \qquad [1]$$

Consequently, from the instant $t_0$ corresponding to the instant of activation of the battery charging phase, if it is assumed that $I_{BAT}$, R, h, ε are constant, it is possible to characterize the temperature rise of the battery at each instant t with the following equation:

$$T_{BAT}(t) = T_{BAT}(t_0) + \Theta \cdot \left(1 - e^{-\frac{(t-t_0)}{\tau}}\right), \text{ with} \quad [2]$$

$$\Theta = \frac{R \cdot (I_{BAT})^2 + \varepsilon}{h \cdot S} + T_{ext} - T_{BAT}(t_0) \quad [3]$$

Moreover, if it is assumed that $I_{BAT}$ is constant (negative in charging mode), it is then possible to estimate the trend of the battery state of charge BSOC over time according to the following equation:

$$BSOC(t) = BSOC(t_0) - \frac{I_{BAT}}{Q_{max}} \cdot (t - t_0) \quad [4]$$

Figure 2:
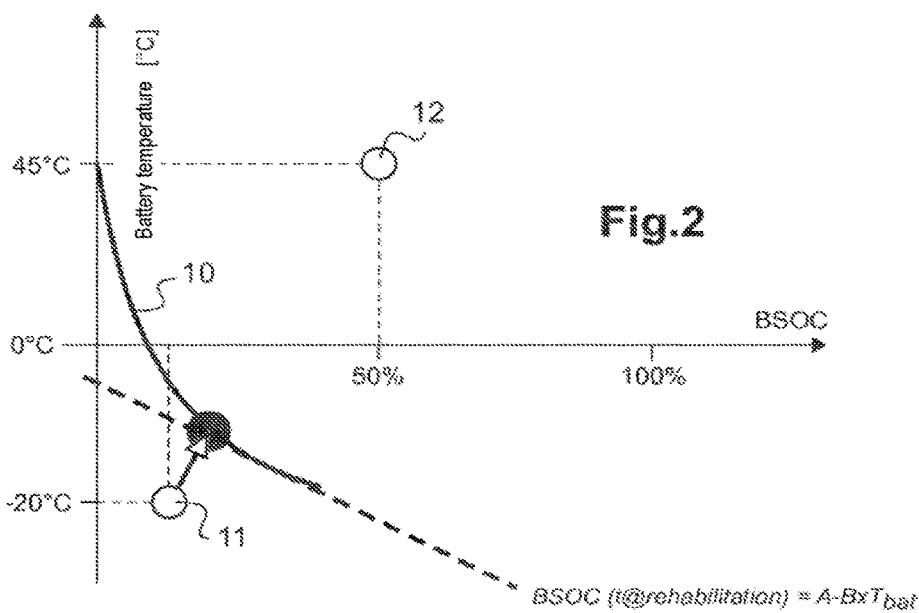
FIG. 2 is a figure similar to FIG. 1 showing the implementation of the invention.

By virtue of the isopower curve 10 referred to in the battery temperature/state-of-charge plane, for a given battery temperature, it is therefore possible to define a threshold BSOC(t@rehabilitation) corresponding to the state of charge for which the battery is capable of supplying the required minimum power level. According to a preferential embodiment illustrated in FIG. 2 it is assumed that this threshold BSOC(t@rehabilitation) depends linearly on the battery temperature. Also, this threshold is defined by approximating the isopower curve 10 with the tangent to the isopower curve relative to a given temperature, for example −15° C. according to the example of FIG. 2. This amounts to locally linearizing the isopower curve 10 so as to define an isopower straight line corresponding to the state-of-charge threshold BSOC(t@rehabilitation) for which the battery can supply the required minimum power level. The equation for this straight line is then:

$$BSOC(t@\text{rehabilitation}) = A - B \times T_{BAT} \quad [5]$$

This straight line intersects the BSOC axis for BSOC=A and has the slope B.

On this basis, from the operating point 11 of the battery, which does not make it possible for the vehicle to "take off" on starting using only the electric motor, the battery being in a state in which it is incapable of supplying the required minimum power level, the duration of the battery charging phase making it possible to bring it to a state enabling it to supply the required minimum power level, will be able to be estimated as being the time needed to bring the operating point 11 of the battery to the isopower curve 10 approximated by the straight line of equation [5] above.

This battery power rehabilitation time results more specifically from the implementation of the following calculations.

In the charging phase, by first of all coupling the equations [2], [4] and [5] described above, the following is obtained:

$$BSOC(t@\text{rehabilitation}) = BSOC(t_0) - \frac{I_{BAT}}{Q_{max}}(t@\text{rehabilitation} - t_0) =$$
$$A - B \times \left\{ T_{Bat}(t_0) + \Theta \cdot \left(1 - e^{-\frac{(t@\text{rehabilitation} - t_0)}{\tau}}\right) \right\}$$

And, finally, the duration of the charging phase making it possible to rehabilitate the battery performance levels is obtained as follows, starting from an operating point of the battery at the instant of activation of the charging phase, defined by $BSOC(t_0)$ and $T_{BAT}(t_0)$:

$$(t@\text{rehabilitation} - t_0) = \frac{(BSOC(t_0) - A + B \cdot T_{Bat}(t_0))Q_{max}}{I_{BAT} - \frac{\Theta \cdot B \cdot Q_{max}}{\tau}} \quad [6]$$

In the case of a battery performance rehabilitation without charging (nil current but heating present), the following is obtained from the equation [2]:

$$(t@\text{rehabilitation} - t_0) = -\tau \cdot \ln\left(1 - \frac{\frac{A - BSOC(t_0)}{B} - T_{bat}(t_0)}{\Theta}\right) \quad [7]$$

For this, it is necessary to determine the value of the current applied to the battery during the charging phase. The route mean square current will be able to be considered as being the square of the instantaneous value of the current during the charging phase. According to another embodiment, this value is determined from a mapping supplying the value of the route mean square current as a function of the state of charge and of the temperature of the battery.

Also, according to a preferential embodiment, it will be possible to calculate, at each instant, the battery performance rehabilitation time from the calculation described by the equation [6] above.

This information concerning the duration of the battery performance rehabilitation time will advantageously be able to be indicated to the driver, for example by means of an appropriate display on the dashboard of the vehicle. Thus, if the vehicle is for example immobilized (zero speed) and the power available in the battery is below a threshold, then, the charging phase is activated by using the electric motor in generator mode and the estimated duration of the charging phase calculated as explained above, corresponding to the battery performance rehabilitation time, is indicated on the dashboard. This is the time that the driver will have to wait at the roadside to allow the battery to revert to state-of-charge and temperature conditions enabling it to ensure the required minimum power level.

The computation means implemented for estimating the duration of the charging phase according to the invention are implemented by a computer embedded in the vehicle, for example the computer of BMS (Battery Management System) type, which is the computer dedicated to and incorporated in the battery. Alternatively, these computation means could be implemented by a higher level computer, for example a computer adapted to control the power train of the vehicle as a whole, in as much as this duration estimation could depend on additional external information not necessarily available on the BMS (outside temperature, availability of the battery reheating system, etc.).

The invention claimed is:

1. A method for estimating a duration of a battery performance rehabilitation phase for a traction battery of a hybrid vehicle including a combustion engine and at least one electric motor, comprising:
   activating the battery performance rehabilitation phase when a power available in the battery is below a required minimum power level to launch the vehicle from a stop using only the electric motor until a target speed at which the combustion engine can cut in, said phase making it possible to bring said battery to state-of-charge and temperature conditions enabling the battery to supply said required minimum power level;

supplying a model of operation of the battery including, in a plane (BSOC, T) where BSOC denotes a state of charge of the battery and where T denotes a temperature of the battery, an isopower curve representing, in said plane, operating points of the battery enabling the battery to substantially deliver said required minimum power level to launch the vehicle from a stop using only the electric motor until the target speed at which the combustion engine can cut in, said curve separating the operating points making it possible to deliver a power level above the required minimum power level from the operating points enabling the battery to deliver only a power level below the required minimum power level; and estimating the duration of said battery performance rehabilitation phase, which represents the duration for the battery to be charged from the power available to the required minimum power level to launch the vehicle from a stop using only the electric motor until the target speed at which the combustion engine can cut in, from said model of operation supplied.

2. The method as claimed in claim 1, wherein said battery performance rehabilitation phase includes a battery charging phase.

3. The method as claimed in claim 2, wherein the estimating the duration of the charging phase comprises:

determining a value of a current supplied to the battery during said charging phase;

determining, from an operating point of the battery defined by the temperature of the battery and the state of charge of the battery at an instant of activation of the charging phase, said operating point allowing the battery to deliver only a power level below the required minimum level, as a function of said current supplied to the battery, the duration of said charging phase as being a time needed to bring the operating point of the battery to said isopower curve.

4. The method as claimed in claim 3, further comprising locally linearizing said isopower curve so as to define a state-of-charge threshold varying linearly with the temperature for which the battery is able to supply said required minimum power level, the duration of said charging phase being determined relative to the state-of-charge threshold.

5. The method as claimed in claim 2, wherein the battery is a traction battery of a hybrid vehicle, comprising a heat engine and at least one electric motor, and said charging phase is carried out by using said at least one electric motor in generator mode.

6. The method as claimed in claim 1, further comprising displaying the estimated duration of said battery performance rehabilitation phase.

7. The method as claimed in claim 2, wherein the required minimum power level is 5 kW.

8. The method as claimed in claim 2, wherein the target speed is 10 km/h.

9. A device for estimating a duration of a battery performance rehabilitation phase for a traction battery of a hybrid vehicle including a combustion engine and at least one electric motor, making it possible to bring a battery into state-of-charge and temperature conditions enabling the battery to supply a required minimum power level, said device comprising:

means for storing a model of operation of the battery including, in a plane (BSOC, T) where BSOC denotes a state of charge of the battery and where T denotes a temperature of the battery, an isopower curve representing, in said plane, operating points of the battery enabling the battery to substantially deliver said required minimum power level to launch the vehicle from a stop using only the electric motor until a target speed at which the combustion engine can cut in, said curve separating the operating points making it possible to deliver a power level above the required minimum power level from the operating points enabling the battery to deliver only a power level below the required minimum power level, and a computer to estimate the duration of said charging phase, which represents the duration for the battery to be charged from the power available to the required minimum power level to launch the vehicle from a stop using only the electric motor until the target speed at which the combustion engine can cut in, from said model of operation supplied.

10. A motor vehicle, comprising:
the estimation device as claimed in claim 9.

11. The estimation device as claimed in claim 9, wherein the required minimum power level is 5 kW.

12. The estimation device as claimed in claim 9, wherein the target speed is 10 km/h.

* * * * *